(12) United States Patent
Tonazzo

(10) Patent No.: US 9,484,339 B2
(45) Date of Patent: Nov. 1, 2016

(54) SMART SEMICONDUCTOR SWITCH

(71) Applicant: Infineon Technologies AG, Neubiberg (DE)

(72) Inventor: Enrico Tonazzo, Villanova di Camposampiero (PD) (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/555,213

(22) Filed: Nov. 26, 2014

(65) Prior Publication Data
US 2016/0148925 A1   May 26, 2016

(51) Int. Cl.
| | |
|---|---|
| H01L 27/02 | (2006.01) |
| H01L 29/06 | (2006.01) |
| H01L 29/08 | (2006.01) |
| H01L 29/10 | (2006.01) |
| H01L 29/78 | (2006.01) |

(52) U.S. Cl.
CPC ....... H01L 27/0259 (2013.01); H01L 27/0255 (2013.01); H01L 27/0266 (2013.01); H01L 27/0288 (2013.01); H01L 29/0646 (2013.01); H01L 29/0649 (2013.01); H01L 29/0847 (2013.01); H01L 29/1087 (2013.01); H01L 29/1095 (2013.01); H01L 29/78 (2013.01)

(58) Field of Classification Search
CPC ........... H01L 27/0259; H01L 27/0255; H01L 27/0288; H01L 29/0646; H01L 29/0649; H01L 29/0847; H01L 29/1087; H01L 29/1095; H01L 29/78
See application file for complete search history.

(56) References Cited

U.S. PATENT DOCUMENTS

| | | |
|---|---|---|
| 4,992,683 A | 2/1991 | Robin, Jr. |
| 5,539,610 A | 7/1996 | Williams et al. |
| 5,629,542 A | 5/1997 | Sakamoto et al. |
| 2004/0228053 A1 | 11/2004 | Thiery et al. |
| 2006/0126245 A1 | 6/2006 | Grose et al. |
| 2008/0224547 A1 | 9/2008 | Pastorina et al. |
| 2011/0102956 A1 | 5/2011 | Nakahara |
| 2012/0169116 A1 | 7/2012 | Graf |
| 2012/0212870 A1 | 8/2012 | Necco |
| 2013/0027114 A1 | 1/2013 | Petruzzi et al. |
| 2014/0091384 A1 | 4/2014 | Petruzzi et al. |
| 2014/0103861 A1 | 4/2014 | Carletti et al. |

FOREIGN PATENT DOCUMENTS

| | | |
|---|---|---|
| DE | 102013218670 A1 | 5/2014 |
| DE | 102013111386 A1 | 6/2014 |

*Primary Examiner* — Tucker J Wright

(74) *Attorney, Agent, or Firm* — Shumaker & Sieffert, P.A.

(57) ABSTRACT

A semiconductor device may comprise a semiconductor substrate, which is doped with dopants of a first doping type and includes a semiconductor layer adjoining a top surface of the semiconductor substrate, the semiconductor layer being doped with dopants of a second doping type; a MOS transistor being integrated in the first semiconductor region; and a protection circuit electrically connected to a portion of the first semiconductor layer and the gate electrode and being configured to charge the gate electrode dependent on a current passing from the first semiconductor layer to a drain electrode of the MOS transistor.

26 Claims, 4 Drawing Sheets

SMART SEMICONDUCTOR SWITCH

TECHNICAL FIELD

Embodiments of the present disclosure relate to the field of integrated electronic circuits, particular to an integrated electronic circuit including a MOS transistor and additional circuitry integrated in one semiconductor die.

BACKGROUND

Many (power) semiconductor switches can be combined with additional low power analog and digital circuitry in one single semiconductor chip. The additional circuitry may additionally include, inter alia, driver circuits for generating driver signals to activate and deactivate the power semiconductor switches, sensor and measurement circuits for processing measured signals such as chip temperature, output current, and circuitry used for communicating with other devices such as microcontrollers or the like.

SUMMARY

In one example, a semiconductor device may comprise a semiconductor substrate, which is doped with dopants of a first doping type and includes a semiconductor layer adjoining a top surface of the semiconductor substrate, the semiconductor layer being doped with dopants of a second doping type; a MOS transistor being integrated in the first semiconductor region; and a protection circuit electrically connected to a portion of the first semiconductor layer and the gate electrode and being configured to charge the gate electrode dependent on a current passing from the first semiconductor layer to a drain electrode of the MOS transistor.

In another example, a semiconductor device comprises a semiconductor substrate, which is doped with dopants of a first doping type and includes a semiconductor layer adjoining a top surface of the semiconductor substrate, the semiconductor layer being doped with dopants of a second doping type; a MOS transistor being integrated in the first semiconductor region; and a protection circuit electrically connected to a portion of the first semiconductor layer and the gate electrode and being configured to charge the gate electrode, when an electric potential of the first semiconductor region reaches a first threshold.

Those skilled in the art will recognize additional features and advantages upon reading the following detailed description, and upon viewing the accompanying drawings.

BRIEF DESCRIPTION OF THE DRAWINGS

The techniques and devices of this disclosure can be better understood with reference to the following description and drawings. The components in the figures are not necessarily to scale, emphasis instead being placed upon illustrating the principles of the invention. Moreover, like reference numerals in the figures designate corresponding parts. In the drawings.

DETAILED DESCRIPTION

Figure 1:
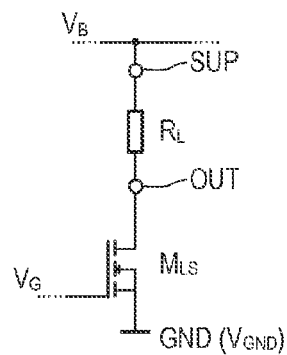
FIG. 1 is a circuit diagram illustrating a MOSFET uses as electronic low-side power switch.

In the following detailed description, reference is made to the accompanying drawings. The drawings form a part of the description and by way of illustration show specific examples, in which the invention may be practiced. It is to be understood that the features of the various embodiments described herein may be combined with each other, unless specifically noted otherwise.

Different technologies are available for manufacturing devices including (power) semiconductor switches. One common problem, however, is the electrical isolation between adjacent circuits or circuit components as well as the isolation of circuits and the surrounding semiconductor substrate. Usually, a so-called pn-junction isolation is used for this purpose. That is, a reverse biased pn-junction isolates two adjacent circuits or circuit components. However, these pn-junctions may form parasitic diodes or bipolar transistors, and the activation of such parasitic diodes and bipolar transistors may lead to undesired current conduction, e.g. in the semiconductor substrate. As a result, the potential may drop to such values that the circuitry, which is integrated in the semiconductor die, becomes (temporarily) inoperative. For example, the state of logic circuits could be reset in an uncontrollable manner, and information, which is used for the operation of the device, may get lost.

For example, the substrate may be p-doped and include an n-doped layer, which may be formed by means of epitactical deposition, diffusion of dopants or other known methods. One or more semiconductor switches may be integrated in the n-doped layer as well as further digital and analog circuitry. The n-doped layer may be segmented, for example, into a plurality of wells, by so-called deep trench isolation (DTI). However, the n-doped layer may be composed of a plurality of n-doped wells separated by p-doped regions (forming pn-junction isolation). In both cases, parasitic npn-type bipolar transistors are formed between adjacent regions (collector and emitter) of the n-doped layer and the subjacent p-doped substrate (base). Isolation structures other than DTI or pn-junction isolation may be used.

In some circumstances the pn-junction forming the mentioned pn-junction isolation may become forward biased, which makes the pn-isolation ineffective and can activate a parasitic bipolar transistor. As a result, current can pass through the pn-junction between p-doped substrate and n-doped layer, which may negatively affect the operation of the circuitry implemented in the n-doped layer. The forward biasing of the pn-junction isolation may occur in various situations. For example, the potential of the drain electrode of the semiconductor switch may become negative with respect to the potential of the source electrode (and p-doped the substrate) when switching inductive loads with low-side n-channel MOSFETs. A similar problem may occur due to disturbances in the supply lines (e.g., due to electrostatic discharges, ESD), which may also lead to a forward biasing of the mentioned pn-junction isolations.

There is a need for an improved semiconductor device which (at least partially) avoids a forward biasing of the pn-junction isolation or avoids the negative effects of such forward-biasing.

FIG. 1 is a circuit diagram illustrating the use of an electronic low-side power switch to switch a load on and off in accordance with a drive signal $V_G$. In the present example, the electronic switch is implemented as an n-channel MOS field effect transistor (MOSFET $M_{LS}$). In the present low-side configuration, a first load terminal of MOSFET $M_{LS}$ is connected to a ground terminal GND (being at ground potential $V_{GND}$) and a second load terminal, which is further referred to as output terminal OUT, is connected to a load that is represented by a resistor $R_L$ in the present example. The load $R_L$ is connected between the output terminal OUT and a supply terminal SUP, at which a supply voltage $V_B$ is provided (relative to the ground potential $V_{GND}$). In essence, the load $R_L$ and the load current path of the MOSFET $M_{LS}$ (drain-source current path) are connected in series, and a load current $i_L$ passes through the load $R_L$ and the load current path of the MOSFET in accordance with the drive signal $V_G$, which is applied to a control electrode of the MOSFET $M_{LS}$ (gate electrode).

The embodiments described below relate to n-channel MOSFETs used as electronic low-side switches. However, various concepts, on which the embodiments described herein are based on, may readily be applied to electronic switches used in a high-side configuration. Therefore, the present disclosure shall not be limited to low-side switches. Furthermore, other types of electronic switches may be used instead of an n-channel MOSFET.

Generally, the embodiments described herein relate to semiconductor devices which use a semiconductor substrate material of a first doping type. During processing of the substrate, various semiconductor regions are formed which may be doped with dopants of the first doping type or a second doping type. In the embodiments described herein, dopants of the first doping type are p-type dopants as a p-doped substrate is used. Accordingly, dopants of the second doping type are n-type dopants. However, the doping types may be exchanged in other embodiments.

Figure 2:
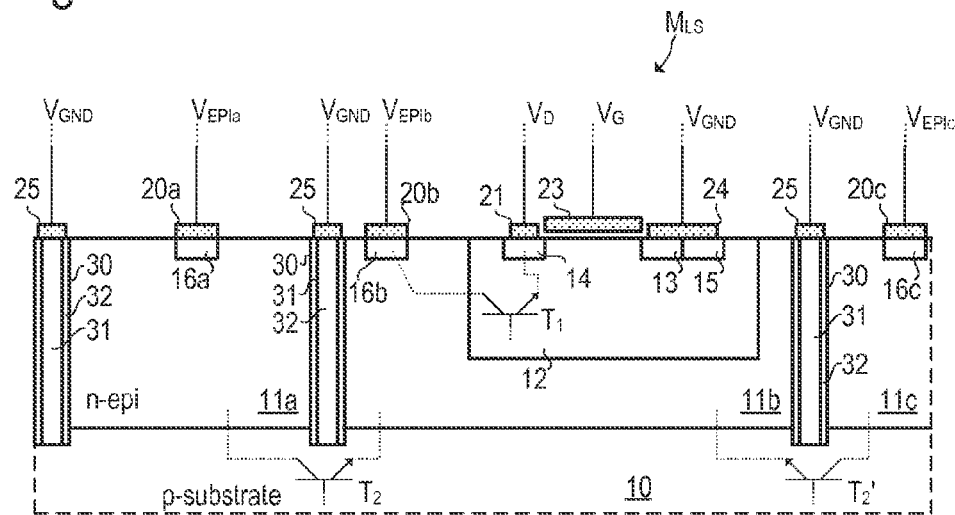
FIG. 2 is a cross-sectional side view of a semiconductor die, in which the MOSFET of FIG. 1 is integrated besides other circuitry.

FIG. 2 illustrates a cross-sectional side view of a semiconductor device, in which at least one semiconductor switch is integrated as well as additional circuitry, which may be used in connection with the semiconductor switch. As mentioned above, the additional circuitry may include, inter alia, driver circuits for generating drive signals to activate and deactivate the semiconductor switch(es), sensor and measurement circuits for measuring and processing signals representing, for example, the chip temperature or the load current, and communication interface circuits for communicating with other devices such as microcontrollers or the like. In the present example, the semiconductor device is composed of, inter alia, p-doped semiconductor substrate 10 which includes, at its top surface, a semiconductor layer 11 of several n-doped regions 11a, 11b, 11c. This semiconductor layer 11 may be formed by epitaxy. However, other techniques may be used to form the semiconductor layer 11, such as, for example, dopant diffusion, plasma diffusion (PLAD) or ion implantation. In the present examples the individual n-doped regions 11a, 11b, 11c of the semiconductor layer 11 are electrically isolated from each other by a deep trench isolation (DTI). Such trench isolations are accomplished by trenches 30 extending vertically into the semiconductor substrate 10 from the top surface of the substrate through the n-doped layer 11 into the subjacent (lying below) p-doped portion of the substrate 10. The trenches may be filled with conductive material 31 (e.g., polycrystalline silicon) which is isolated from the adjoining n-doped layer 11 by an isolation layer 32 (e.g. a silicon oxide layer). The trenches 30 separate the n-doped semiconductor layer 11 into separate segments of n-doped regions 11a, 11b, 11c, and allow to contact the p-doped portion of the substrate 10 through the n-doped semiconductor layer 11. Electrodes 25 at the top end of each trenches 30 are used to electrically connect the p-doped portion of the substrate 10 with other circuit components. In the present example of a low-side switch, ground potential $V_{GND}$ is applied to the p-doped substrate 10 via the electrodes 25. As an alternative to the trench isolation, pn-junction isolations may be used to isolate two neighboring n-doped regions 11a, 11b, 11c from each other.

Each n-doped region 11a, 11b, 11c may include various circuit components. In the present example, the semiconductor switch (see FIG. 1, switch $M_{LS}$) is integrated in region 11b, whereas regions 11a and 11c include further circuitry, which is not explicitly shown to keep the illustration simple. Each n-doped region 11a, 11b, 11c includes a respective contact region 16a, 16b, 16c, which is also n-doped but with a higher concentration of dopants than the surrounding semiconductor material of the regions 11a, 11b, 11c. The contact regions allow to electrically contact the n-doped region 11a, 11b, and 11c by means of electrodes 20a, 20b, 20c, which may be of metal or other electrically conductive material (e.g., polycrystalline silicon). The electric potentials of the regions 118, 11b, and 11c are referred to as $V_{EPIa}$, $V_{EPIb}$, and $V_{EPIc}$. In the following the implementation of the MOSFET $M_{LS}$ is explained first. As a body region of the MOSFET, a p-doped well 12 is formed in the n-doped region 11b. The p-doped well 12 may be formed, e.g., by dopant deposition, PLAD, ion implantation or any other suitable process, and extends from the top surface into the n-doped region 11b. Within the p-doped well 12, a drain region 14 and a source region 13 are formed. Both regions 13, 14 are heavily n-doped and may also be formed by any suitable doping process. Furthermore, a body-contact region 15 is formed within the p-doped well 12. Body-contact region 15 is heavily p-doped (with a higher dopant concentration than the well 12).

A drain electrode 21 is disposed on the top surface of the drain regions 14. Similarly, a source electrode 24 is disposed on the source region 13 and the body contact region 15 thus short-circuiting the intrinsic diode between body region 12 and source region 13. In the present example (low side configuration of the semiconductor switch) the source electrode 24 is connected with ground potential $V_{GND}$. A gate electrode 23 is arranged on (but isolated against) the surface of the p-doped well 12. In a lateral direction, the gate electrode 23 extends from the drain region 14 to the source region 13. When the gate is appropriately charged, a MOS channel of n-type charge carriers 4 develops under the gate electrode from the source region 13 to the drain region 14.

The voltage at the gate electrode 23 is denoted as $V_G$. The voltage of the drain electrode 21 is denoted as $V_D$.

During normal operation of the MOSFET as a low side switch, the p-doped substrate 10 is at ground potential $V_{GND}$, which is applied to the substrate 10 via the electrodes 25. Furthermore, the source region 15 and the body region 12 are also at ground potential $V_{GND}$, which is applied via the source electrode 24. During normal operation, the drain voltage $V_D$ as well as the voltage $V_{EPIb}$ are positive (with respect to the ground potential). Thus, the pn-junction between the n-doped region 11b and the p-doped well 12, the pn-junction between the n-doped region 11b and subjacent p-doped portion of the substrate 10, and the pn-junction between the p-doped well 12 and the drain region 14 are reverse biased (i.e. forming a pn-junction isolation).

However, one typical problem of integrated semiconductor switches arises when the drain voltage $V_D$ and thus the voltage of the n-doped region 11b becomes negative (at least temporarily), which may happen due to various causes such as, for example, electrostatic discharges (ESD), inductive load, etc. ($V_D < V_{GND}$, $V_{GND} = 0V$). In this case ($V_D < 0V$), the above-mentioned pn-junction between the well 12 and the drain region 14 becomes forward biases and current may pass through the pn-junction from the p-doped well 12 (body of the MOSFET) to the drain region 14. This current may be regarded as base current activating a parasitic npn-type bipolar junction transistor $T_1$ formed by region 11b (n-doped, collector), well 12 (p-doped, base), and drain region 14 (n-doped, emitter). As a result of the full activation of parasitic the bipolar junction transistor $T_1$ so that it operates in its saturation region, the collector-emitter-voltage $V_{EPIb} - V_D$, of this parasitic transistor $T_1$ may fall close to zero and, consequently, the potential of the n-doped region 11b may also drop below ground potential ($V_{EPIb} < 0$). As a consequence, the pn-junction between the p-doped portion of substrate 10 and n-doped region 11b may become forward biased, which gives rise to an emitter current of a further parasitic npn-type bipolar junction transistor $T_2$. Transistor $T_2$ is formed by the n-doped region 11a (collector), the subjacent p-doped substrate 10 (base) and the n-doped region 11b, in which the MOSFET is integrated. Further parasitic non-type bipolar junction transistors (e.g., transistor $T_2$') may be formed between n-doped region 11b and other neighboring n-doped regions (e.g. region 11c). For example, parasitic transistor $T_2$' may connect region 11b (emitter) and region 11c (collector) via subjacent substrate 10 (base). When the voltage $V_{EPIb}$ in region 11b is pulled down (to negative values) as a result of the activation of the parasitic transistor $T_1$, the voltages $V_{EPIa}$, $V_{EPIc}$ of neighboring regions 11a, 11c are also pulled down as a result of activation of the further parasitic bipolar junction transistors $T_2$, $T_2$', etc. Low voltages $V_{EPIa}$, $V_{EPIc}$ in the regions 11a, 11b, 11c, etc, of n-doped layer 11 may result in inoperative circuits and failure (e.g. an undesired reset of logic circuits) of the overall device.

Figure 3:
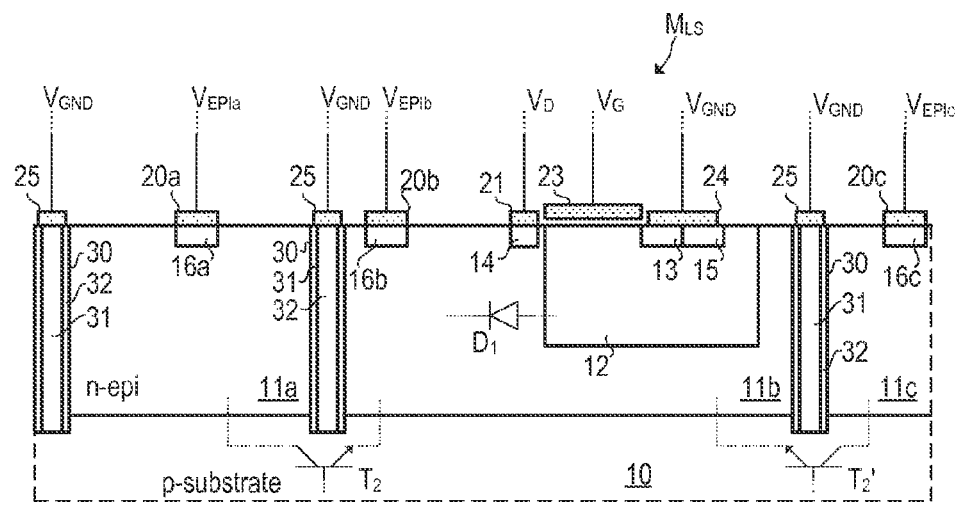
FIG. 3 is a cross-sectional side view illustrating an alternative implementation of the example of FIG. 2.

FIG. 3 illustrates a cross-sectional side view almost identical to the previous example of FIG. 2. The only difference is that, in accordance with the alternative example of FIG. 3, the drain region 14 is not embedded in the p-doped well 12 but in the n-doped region 11b adjacent to (or adjoining) the p-doped well 12. As a result, the drain region 14, then-doped region 14, and the contact region 16b are always at the same potential, i.e. at drain potential $V_D$ ($V_{EPIb} = V_D$). As a result, there is no parasitic non-type bipolar junction transistor $T_1$. Nevertheless, parasitic non-type bipolar junction transistor $T_2$, $T_2$' may still be activated in response to the drain voltage $V_D$ becoming negative, since the voltage $V_{EPIb}$ is equal to (and tied to) the drain voltage $V_D$ due to the layout of the device, and transistors $T_2$, $T_2$' are directly activated due to a negative voltage $V_D = V_{EPIb}$ (as in the previous example of FIG. 2). Besides the mentioned difference, the current example is the same as the previous example of FIG. 2 and reference is made to the above description to avoid unnecessary repetitions.

Figure 4:
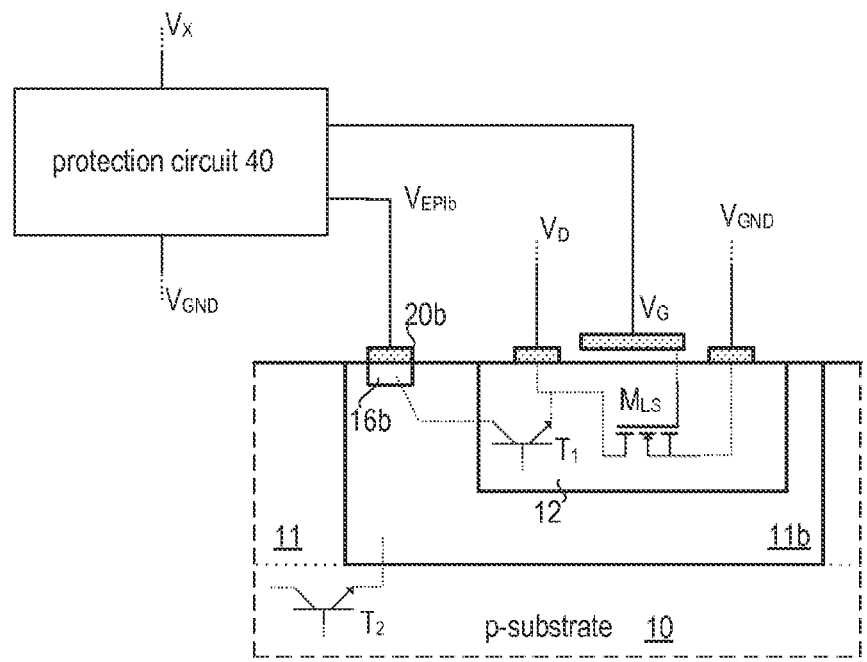
FIG. 4 is a cross-sectional side view illustrating a first embodiment of an electronic switch in accordance with the present invention.

FIG. 4 illustrates a cross-sectional side view of a first example of a smart switch in accordance with the present invention. Similar to the previously described example, the smart switch is integrated in a substrate 10, which is doped with dopants of a first doping type (p-type dopants in the present case). The substrate 10 includes, at its top surface, a semiconductor layer 11 including one or more semiconductor regions 11b, which are doped with dopants of a second doping type (n-type dopants in the present example). This semiconductor layer 11 may be formed by epitaxy. However, other techniques may be used to form the semiconductor layer 11, such as, for example, dopant diffusion, PLAD or ion implantation. The semiconductor layer 11 may be segmented into several semiconductor regions 11a, 11b, 11c, etc. which are electrically isolated from each other by a trench isolation or pn-junction isolation. A well 12 is formed in one of semiconductor regions (region 11b); the well 12 is doped with dopants of the first doping type (p-type dopants in the present example) and a power MOSFET MLS is formed in the well 12, which is the body (also referred to as bulk) region of the MOSFET $M_{LS}$. In FIG. 4, the MOSFET $M_{LS}$ is represented by a circuit symbol, as the exact implementation is not important for the present discussion.

Similar to the previous example of FIG. 2, the MOSFET $M_{LS}$ has a drain electrode 21, a gate electrode 23, and a source electrode, which is connected to ground potential $V_{GND}$ in case of a low side switch. The voltage at the drain electrode 21 is denoted as $V_D$ and the voltage at the gate electrode is denoted as $V_G$. A parasitic bipolar junction transistor $T_1$ is formed between the drain electrode 21 (emitter of transistor $T_1$), the well 12 (base of transistor $T_1$) and an electrode 20b (collector of transistor $T_1$), which electrically contacts segment 11b of the semiconductor layer 11 (via semiconductor region 16b). The voltage of the segment 11b is denoted as $V_{EPIb}$. At least one further parasitic bipolar junction transistor $T_2$ may be formed between the segment 11b (emitter of transistor $T_2$) of the semiconductor layer 11, the substrate 10 (base of transistor $T_2$) and further segments (portions) of the semiconductor layer 11.

A protection circuit 40 is coupled to the electrode 20b contacting the segment 11b of the semiconductor 11 (e.g. epitaxial layer) to detect a current $i_C$ passing from the segment 11b to the drain electrode of the MOS transistor (i.e. a collector current $i_C$ of the parasitic bipolar transistor in the example of FIG. 4). Furthermore, the protection circuit 40 is configured to charge and discharge the gate of the MOSFET $M_{LS}$ dependent on the current $i_C$. The current $i_C$ may be detected indirectly, for example, by monitoring the electric potential $V_{EPIb}$ of the semiconductor region 11b and detecting when the electric potential $V_{EPIb}$ of the semiconductor region 11b reaches a first threshold. The first threshold may be, for example, equal or close to the potential $V_{GND}$ (e.g. ground potential), which is also present in the substrate 10. In response to a positive detection i.e. voltage $V_{EPIb}$ reaches the first threshold—the protection circuit 40 generates a voltage signal supplied to the gate electrode 23 of the MOSFET $M_{LS}$ to activate (switch on) the MOSFET. Again, as a result of the activation of the MOSFET, the drain voltage $V_D$ is pulled towards the source voltage (which equals $V_{GND}$ in the present example). In this situation (activated MOSFET $M_{LS}$) the voltage difference $V_D-V_{GND}$ is too small to fully activate (switch on) the parasitic bipolar transistor $T_1$ so that it operates in its saturation region. As a final result, the voltage $V_{EPIb}$ of semiconductor region 11b remains high enough that parasitic bipolar transistor $T_2$ is not activated, and the circuitry integrated in the segment 11b (and neighboring segments) of semiconductor layer 11 are thus protected.

Figure 5:
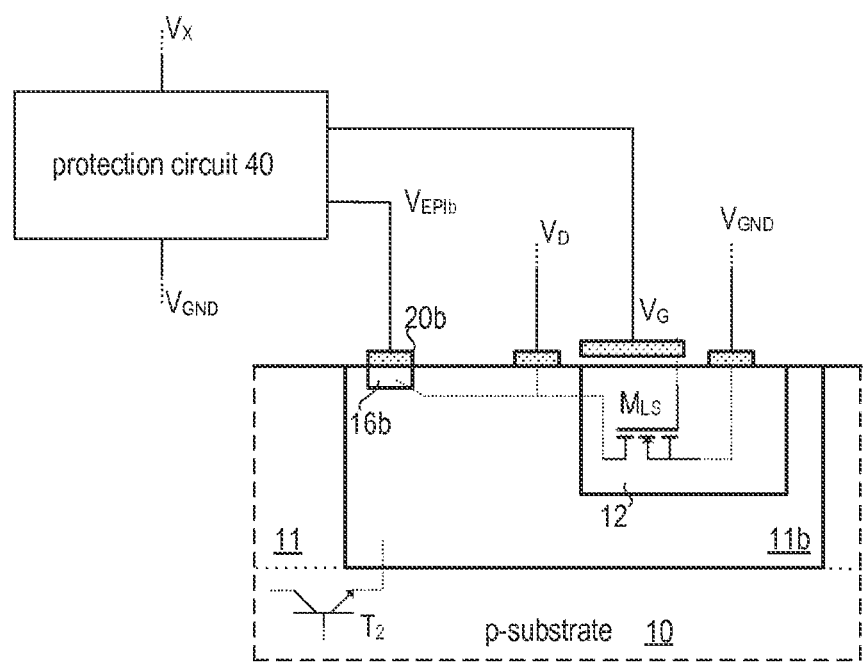
FIG. 5 is a cross-sectional side view illustrating a second embodiment of an electronic switch in accordance with the present invention.

The example illustrated in FIG. 5 is essentially the same as the example of FIG. 4 with the difference that the drain electrode is not arranged on the top surface of the well 12, but besides the well 12 similar like in the example of FIG. 3. For this reason, the voltage $V_{EPIb}$ of the semiconductor region 11b is equal to the drain voltage $V_D$. An undesired (negative) voltage swing in the drain voltage $V_D$ down to negative values directly affects the voltage $V_{EPIb}$ without a prior activation of a parasitic bipolar transistor (like transistor $T_1$ in FIG. 4). The function of the protection circuit 40 is essentially the same as in the previous example. It is configured to monitor the current $i_C$ passing from the segment 11b to the drain electrode of the MOS transistor and to charge and discharge the gate of the MOSFET $M_{LS}$ dependent on the current $i_C$. Like in the previous example, the voltage $V_{EPIb}$ may be monitored to detecting the current $i_C$. In response to a positive detection, i.e. when voltage $V_{EPIb}$ reaches the first threshold, the protection circuit 40 generates a voltage signal supplied to the gate electrode 23 of the MOSFET $M_{LS}$ to activate (switch on) the MOSFET. To avoid repetitions, reference is made to FIG. 4 and the respective description, which also applies to FIG. 5.

In essence, the protection circuit 40 includes a feedback loop which charges the gate of the MOSFET $M_{LS}$ in response to (an dependent on) a current $i_C$ passing from the segment 11b of the of the semiconductor layer 11 to the drain of the MOSFET $M_{LS}$. Charging the gate of the MOSFET $M_{LS}$ results in an increased conductivity of the MOSFET $M_{LS}$, which then draws the drain potential $V_D$ towards the source potential (ground potential in the present example), which finally counteracts the current $i_C$.

Figure 6:
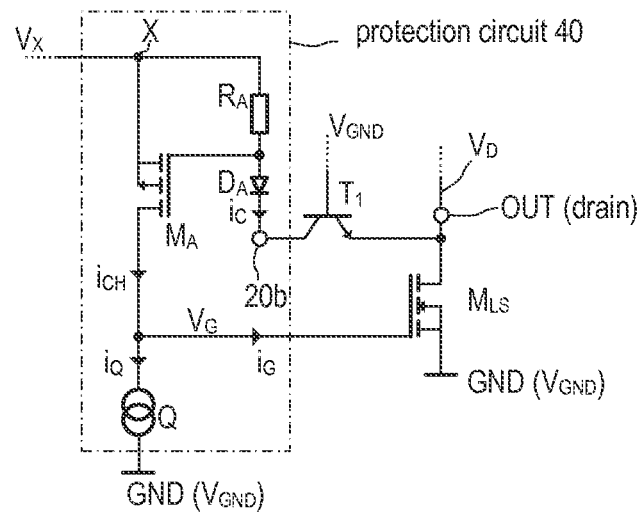
FIG. 6 is a circuit diagram illustrating the electronic low side switch, which is implemented in accordance with the example of FIG. 2, and a monitoring circuit for detecting and preventing activation of parasitic bipolar transistors.

FIG. 6 is a circuit diagram illustrating one exemplary circuit which may be employed to prevent the activation of parasitic bipolar junctions transistors $T_1$, $T_2$, $T_2'$, etc. and the negative consequences resulting therefrom. As the present example relates to an electronic low-side switch, the MOSFET $M_{LS}$ is connected to ground terminal GND via its source electrode (see FIG. 2, electrode 24), while the drain electrode (see FIG. 2, electrode 21) is connected to output terminal OUT. As in the general application example of FIG. 1 a load (not shown) may be coupled between the output terminal and a supply terminal, which provides a supply voltage for the load. The parasitic npn-type bipolar junction transistor $T_1$ is also included in FIG. 6. Accordingly, transistor $T_1$ is connected between the output terminal OUT (drain electrode) of the low side switch and electrode 20b, which is connected to the n-doped region 11b (i.e. one portion of the semiconductor layer 11). As the base of transistor $T_1$ is formed by the body region of the MOSFET $M_{LS}$, the base is electrically coupled to ground potential $V_{GND}$ (see FIG. 2). The further circuit components (diode $D_A$, resistor $R_A$, p-channel field effect transistor $M_A$, and current source Q) shown in FIG. 6 form part of a protection circuit 40, which is configured to detect an undesired collector current $i_C$ passing through parasitic transistor $T_1$ and to activate the electronic low-side switch (MOSFET $M_{LS}$) upon detection of a sufficiently high collector current $i_C$. The diode $D_A$ is, however, optional, as will be explained later. If the low-side switch is activated, the voltage $V_D$ at the output terminal OUT (drain voltage of the MOSFET $M_{LS}$) will be drawn towards zero. As a consequence, the base-emitter voltage $V_{GND}-V_D$ of parasitic transistor $T_1$ falls below a threshold voltage of the base-emitter diode of transistor $T_1$ (approximately 0.7 V for silicon diodes). Thus, the parasitic transistor $T_1$ is deactivated.

The above explanation is a simplifying description of the protection circuit's function. In fact, the process of activation and deactivating the low-side switch and the parasitic transistor is a continuous process during which the transistors gradually become more conductive (when activated) or more resistive (when deactivated). Thus, the mentioned protection circuit 40 provides a negative feedback loop, which continuously counteracts an full activation of parasitic transistor $T_1$ (and thus prevents an operation of the parasitic bipolar transistor in its saturation region) by regulating the conductivity of the low-side MOSFET $M_{LS}$. The feedback control loop is essentially formed by the p-channel field effect transistor $M_A$, diode $D_A$, and the resistor $R_A$. Resistor $R_A$ and diode $D_A$ are connected in series between the electrode 22b and a circuit node X, at which an internal supply voltage $V_X$ is provided (e.g. $V_X$=5V). As such, diode $D_A$ and resistor $R_A$ are connected in series to the collector-emitter current path of parasitic bipolar transistor $T_1$, and collector current $i_C$ will thus also pass through resistor $R_A$ causing a voltage drop $R_A \cdot i_C$ across the resistor $R_A$. The gate of field effect transistor $M_A$ is coupled to resistor $R_A$ such that the gate-source voltage of field effect transistor $M_A$ is determined by the voltage drop $R_A \cdot i_C$ across the resistor $R_A$. In the present example, the gate of field effect transistor $M_A$ is connected to the common circuit node of resistor $R_A$ and diode $D_A$, and the source of field effect transistor $M_A$ is connected to circuit node X. Thus the voltage drop $R_A \cdot i_C$ across the resistor $R_A$ is applied as gate-source voltage to the gate of field effect transistor $M_A$. As a result, the channel of field effect transistor $M_A$ will become conductive as soon as the collector current $i_C$ of parasitic transistor $T_1$ causes a voltage drop $R_A \cdot i_C$ across the resistor $R_A$ that exceeds the threshold voltage of field effect transistor $M_A$.

The drain of the field effect transistor $M_A$ is coupled to the gate electrode of the low-side MOSFET $M_{LS}$. Thus, the current charging the gate of the low-side MOSFET $M_{LS}$ can be controlled by the field effect transistor $M_A$. As mentioned above, the channel of field effect transistor $M_A$ Will become conductive as soon as the voltage drop $R_A \cdot i_C$ exceeds a given threshold. This gives rise to a drain current $i_{CH}$ passing through the field effect transistor $M_A$ which charges the gate of low-side MOSFET $M_{LS}$. As a result, the low-side MOSFET $M_{LS}$ becomes conductive, which pulls the drain potential $V_D$ of low-side MOSFET $M_{LS}$ towards ground (source potential $V_{GND}$), which finally reduces the collector current flow through parasitic transistor $T_1$. A current source (generally a discharge circuit) is coupled to the gate of low-side switch $M_{LS}$ to allow discharging of the gate when field effect transistor $M_A$ is inactive. As an alternative to the current source Q, a resistor may be used. The effective gate current $i_G$ for the low-side MOSFET $M_{LS}$ is $i_{CH}-i_Q$. Summarizing the above, the negative feedback loop of the protection circuit 40 counteracts a negative drain potential $V_D$, which gives rise to an undesired collector current $i_C$, by driving the low-side MOSFET dependent in the collector current $i_C$. The electric potential of the electrode 20b (which is equal to the electric potential of the semiconductor region 11b) equals $V_X-R_A \cdot i_C-V_{DA}$, wherein $V_{DA}$ is the forward voltage drop across the diode $D_A$. If this voltage is higher than a threshold $V_{GND}-V_{BE}$ (wherein $V_{BE}$ is the forward voltage of the base-emitter diode of the parasitic bipolar transistors $T_2$, $T_2'$, etc.), then the full activation (i.e. a transistor operation in its saturation region) of parasitic transistor $T_1$ as well as of the further parasitic transistors $T_2$, $T_2'$, etc. is avoided. In essence, the negative feedback loop is activated when the electric potential of the semiconductor region 11b reaches the given threshold value, which depends on forward voltages of diode $D_A$ and the base-emitter diode of parasitic bipolar junction transistor $T_1$. As the activation of the field effect transistor $M_A$ results from the activation of parasitic bipolar transistor $T_1$, the diode $D_A$ may be necessary only to block other inverse current paths that could charge the circuit node X (at which voltage $V_X$ is applied) if other circuitry is connected to the electrode 20b in normal operation. If such a current path is not present, the diode DA may be omitted. As such, the diode $D_A$ is optional.

Figure 7:
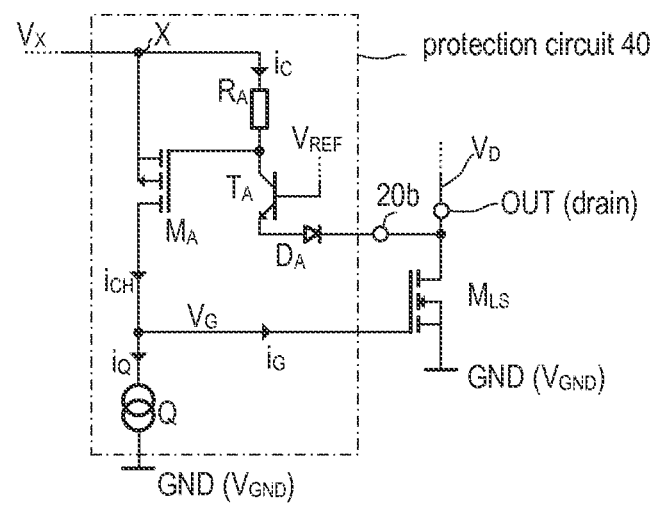
FIG. 7 is a circuit diagram illustrating the electronic low side switch, which is implemented in accordance with the alternative example of FIG. 3, and a monitoring circuit for detecting and preventing activation of parasitic bipolar transistors.

The circuit of FIG. 6 is applicable to a smart semiconductor switch device as illustrated in FIG. 2. That is, the circuit of FIG. 6 can be used when the drain region (see FIG. 2, drain region 14) of the low-side switch $M_{LS}$ is isolated from the neighboring n-doped region 11b by an interjacent p-region (see FIG. 2, p-doped well 12). For use with a smart semiconductor switch device as illustrated in FIG. 3, i.e. in case the drain region (see FIG. 3, drain region 14) of the low-side switch $M_{LS}$ is not isolated from the neighboring n-doped region 11b, the protection circuit 40 of FIG. 6 has to be slightly modified as illustrated in the example FIG. 7. In essence, the circuit of FIG. 7 is identical to the circuit of FIG. 6 except that a bipolar junction transistor $T_A$ is inserted between resistor $R_A$ and diode $D_A$, so that the collector-emitter current path of transistor $T_A$ is connected in series to diode $D_A$ and resistor $R_A$. The gate of field effect transistor $M_A$ is connected to the common circuit node of transistor $T_A$ and resistor $R_A$. The base of bipolar junction transistor $T_A$ is connected to a bias voltage $V_{REF}$ (e.g., $V_{REF}$=0.8 V). As mentioned above, with regard to FIG. 6, the diode $D_A$ is optional. Particularly when the transistor $T_A$ has a breakdown voltage sufficiently high to block the inverse current path, over which the circuit node X could be charged (in case other circuitry is connected to the node 20b in normal operation) the diode $D_A$ may be omitted and the bias voltage may be set to ground potential $V_{GND}$ (0 V). Basically, the protection circuit 40 of FIG. 7 is the same as the protection circuit 40 used in the example of FIG. 6. However, the bipolar transistor $T_A$ is used in the protection circuit of FIG. 7 whereas the parasitic transistor $T_1$ performs the same function in the example of FIG. 6.

As explained above with reference to FIG. 3, a negative drain voltage $V_D$ may result in an activation of the parasitic bipolar transistors $T_2$, $T_2'$, etc. A base current may pass through the base-emitter diode of parasitic transistors $T_2$, $T_2'$, etc., giving rise to even higher emitter currents (substrate current) $i_S$, which pass through the substrate 10 and are drained via the n-doped region 11b. A negative drain voltage $V_D$ entails a forward biased base-emitter diode of transistor $T_A$, and thus will activate transistor $T_A$. As a consequence, a base current through transistor $T_A$ will result in a corresponding collector current $i_C$, which passes through resistor $R_A$ causing a voltage drop $R_A \cdot i_C$ across resistor $R_A$. This voltage drop has essentially the same effect as in the previous example of FIG. 6. That is, field effect transistor $M_A$ is activated as soon as the voltage drop $R_A \cdot i_C$ exceeds the threshold voltage of field effect transistor $M_A$. When field effect transistor $M_A$ is active, the gate of the low-side switch $M_{LS}$ is charged via field effect transistor $M_A$. As a result, the low-side switch $M_{LS}$ becomes conductive which counteracts the negative drain voltage $V_D$ as explained above. Similar as in the previous example of FIG. 4 the negative feedback loop is activated when the electric potential of the semiconductor region 11b reaches a given threshold value, which depends on the bias voltage applied to the base of bipolar junction transistor $T_A$ and the forward voltages of diode $D_A$ and the base-emitter diode of bipolar junction transistor $T_A$. As mentioned above, the diode $D_A$ is optional.

Figure 8:
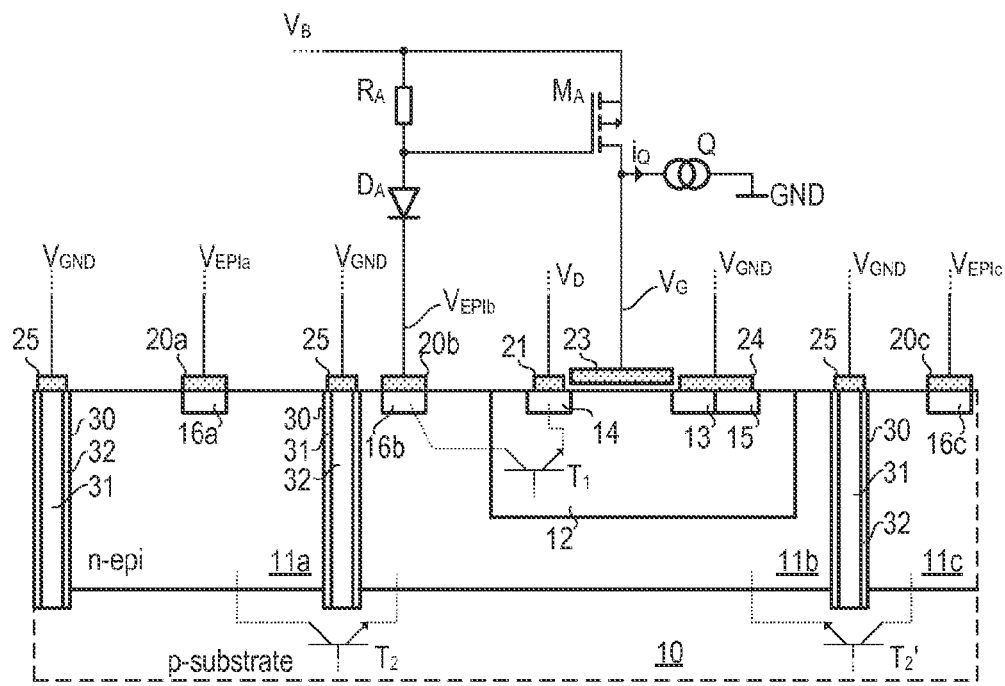
FIG. 8 corresponds to the example of FIG. 4, wherein the electronic low side switch is depicted as cross-sectional side view of the semiconductor die.
Figure 9:
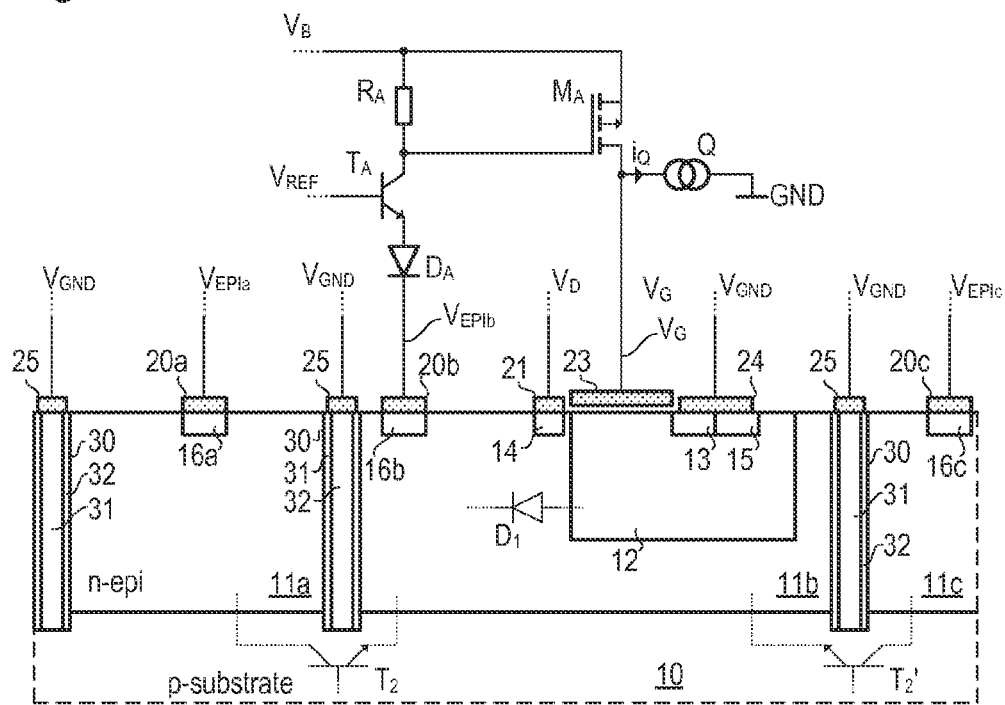
FIG. 9 corresponds to the example of FIG. 5, wherein the electronic low side switch is depicted as cross-sectional side view of the semiconductor die.

FIGS. 8 and 9 correspond to FIGS. 6 and 7. However, the symbols representing low-side switch $M_{LS}$ in FIGS. 6 and 7 are replaced by the cross-sectional side views of FIGS. 2 and 3, respectively, in order to show how the protection circuits 40 are connected to the semiconductor device.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

I claim:

1. A semiconductor device comprising:
   a semiconductor substrate, which is doped with dopants of a first doping type and includes a semiconductor layer adjoining a top surface of the semiconductor substrate, the semiconductor layer being doped with dopants of a second doping type;
   a MOS transistor including a gate electrode and being integrated in the semiconductor layer; and
   a protection circuit electrically connected to a portion of the semiconductor layer and the gate electrode and being configured to charge the gate electrode dependent on a current passing from the semiconductor layer to a drain electrode of the MOS transistor.

2. The semiconductor device of claim 1,
   wherein the semiconductor layer is segmented into a first semiconductor region and at least a second semiconductor region, which are electrically isolated from each other, the portion of the semiconductor layer, to which the protection circuit is connected, being the first semiconductor region of the semiconductor layer.

3. The semiconductor device of claim 2, wherein the first semiconductor region and the second semiconductor region are electrically isolated from each other by an isolation structure.

4. The semiconductor device of claim 3 wherein the isolation structure includes at least one of: a trench isolation and a pn-junction isolation.

5. The semiconductor device of claim 3, wherein the isolation structure includes at least one trench which has sidewalls covered with an isolation layer, the at least one trench being filled with conductive material, which establishes an electric contact to the semiconductor substrate subjacent to the trench.

6. The semiconductor device of claim 5, wherein the at least one trench is covered by an electrode at the top surface of the semiconductor substrate, the electrode being coupled to ground potential.

7. The semiconductor device of claim 2, wherein the MOS transistor is composed of a drain region, a body region, and a source region, which are included in the first semiconductor region, as well as the gate electrode, which is arranged at the top surface of the semiconductor substrate adjacent to the first semiconductor region, but isolated therefrom.

8. The semiconductor device of claim 7, further comprising a first well, which is doped with dopants of the first doping type and arranged in the first semiconductor region; the well forming the body region of the MOS transistor.

9. The semiconductor device of claim 8, wherein the drain region of the MOS transistor is arranged in the first well, so that the drain region, the body region and the first semiconductor region form a parasitic bipolar junction transistor.

10. The semiconductor device of claim 9, wherein the protection circuit includes a resistor and a diode that are electrically connected in series to a collector-emitter current path of the parasitic bipolar junction transistor.

11. The semiconductor device of claim 8, wherein the drain region of the MOS transistor is arranged in the first semiconductor region adjacent to the well.

12. The semiconductor device of claims 11, wherein the protection circuit includes a resistor and a transistor that are connected in series between the first semiconductor region and a supply node providing a supply voltage.

13. The semiconductor device of claims 12, wherein the transistor is a bipolar junction transistor having a base which is biased with a given bias voltage.

14. The semiconductor device of claim 12, wherein the protection circuit includes a further transistor which controls conductivity of a current path between the supply node and the gate electrode of the MOS transistor, wherein the further transistor controls the conductivity dependent on a voltage drop across the resistor.

15. The semiconductor device of claim 7, wherein the protection circuit includes a further transistor, which controls conductivity of a current path between a supply node and the gate electrode of the MOS transistor to charge the gate electrode of the MOS transistor.

16. The semiconductor device of claim 5, wherein the protection circuit includes a discharge circuit coupled to the gate electrode and configured to discharge the gate electrode.

17. The semiconductor device of claim 16, wherein the discharge circuit includes a current source.

18. The semiconductor device of claim 2, wherein the first and the second semiconductor region are coupled by a parasitic bipolar junction transistor.

19. The semiconductor device of claim 18, wherein the semiconductor substrate, which is doped with dopants of the first doping type, forms a base of the parasitic bipolar junction transistor.

20. The semiconductor device of claim 2, wherein the protection circuit includes a resistor and a diode electrically coupled between the first semiconductor region and a supply node providing a supply voltage.

21. The semiconductor device of claim 20, wherein the protection circuit includes a further transistor, which controls conductivity of a current path between the supply node and the gate electrode of the MOS transistor, wherein the further transistor controls the conductivity dependent on a voltage drop across the resistor.

22. The semiconductor device of claim 1,
wherein the MOS transistor is a low side transistor, and
wherein the semiconductor substrate, which is doped with dopants of the first doping type, is operably coupled to ground potential.

23. The semiconductor device of claim 1,
wherein the semiconductor substrate, which is doped with dopants of the first doping type, and a source region of the MOS transistor are operably coupled to ground potential.

24. A semiconductor device comprising:
a semiconductor substrate, which is doped with dopants of a first doping type and includes a semiconductor layer adjoining a top surface of the semiconductor substrate, the semiconductor layer being doped with dopants of a second doping type;
a MOS transistor including a gate electrode and being integrated in the semiconductor layer; and
a protection circuit electrically connected to a portion of the semiconductor layer and the gate electrode and being configured to charge the gate electrode, when an electric potential of a first semiconductor region reaches a first threshold.

25. The semiconductor device of claim 24,
wherein the semiconductor layer is segmented into the first semiconductor region and at least a second semiconductor region, which are electrically isolated from each other,
the portion of the semiconductor layer, to which the protection circuit is connected being the first semiconductor region of the semiconductor layer.

26. The semiconductor device of claim 25, wherein the first semiconductor region and the second semiconductor region are electrically isolated by an isolation structure.

* * * * *